United States Patent [19]

Nath et al.

[11] Patent Number: 4,520,757

[45] Date of Patent: Jun. 4, 1985

[54] PROCESS GAS INTRODUCTION, CONFINEMENT AND EVACUATION SYSTEM FOR GLOW DISCHARGE DEPOSITION APPARATUS

[75] Inventors: Prem Nath, Rochester; Kevin R. Hoffman, Sterling Heights; Timothy D. Laarman, Almont, all of Mich.

[73] Assignee: Energy Conversion Devices, Inc., Troy, Mich.

[21] Appl. No.: 564,863

[22] Filed: Dec. 23, 1983

Related U.S. Application Data

[63] Continuation-in-part of Ser. No. 437,075, Oct. 27, 1982, Pat. No. 4,462,333.

[51] Int. Cl.³ ............................................ C23C 11/00
[52] U.S. Cl. ..................................... 118/723; 136/258; 204/298
[58] Field of Search ................. 118/723; 204/192 R, 204/192 P, 192 E, 298; 136/258 AM

[56] References Cited

U.S. PATENT DOCUMENTS

| | | | |
|---|---|---|---|
| 4,369,730 | 1/1983 | Izu et al. | 118/723 |
| 4,410,558 | 10/1983 | Izu et al. | 427/39 |
| 4,418,645 | 12/1983 | Knights | 118/715 |

*Primary Examiner*—Aaron Weisstuch
*Attorney, Agent, or Firm*—Marvin S. Siskind; Ronald W. Citkowski

[57] ABSTRACT

A system for introducing, confining and evacuating process gases adjacent the cathode region of glow discharge deposition apparatus, said apparatus adapted to deposit at least one layer of semiconductor material onto a substrate. The deposition apparatus includes at least one dedicated deposition chamber into which process gases are introduced for glow discharge disassociation into species. The system of the present invention includes a baffling manifold adjacent the cathode, said manifold adapted to (1) substantially prevent adjacent slowly and rapidly moving streams of process gases from forming flow patterns as the semiconductor material is deposited onto the substrate, and (2) thoroughly mix the process gases for only introducing homogeneous, uniform process gas mixtures into the plasma region, thereby preventing adjacent nonhomogeneous, nonuniform mixtures from forming flow patterns as the semiconductor material is deposited onto the substrate. The system is also adapted to expose the entire transverse width of the substrate for the deposition of semiconductor material thereunto.

3 Claims, 4 Drawing Figures

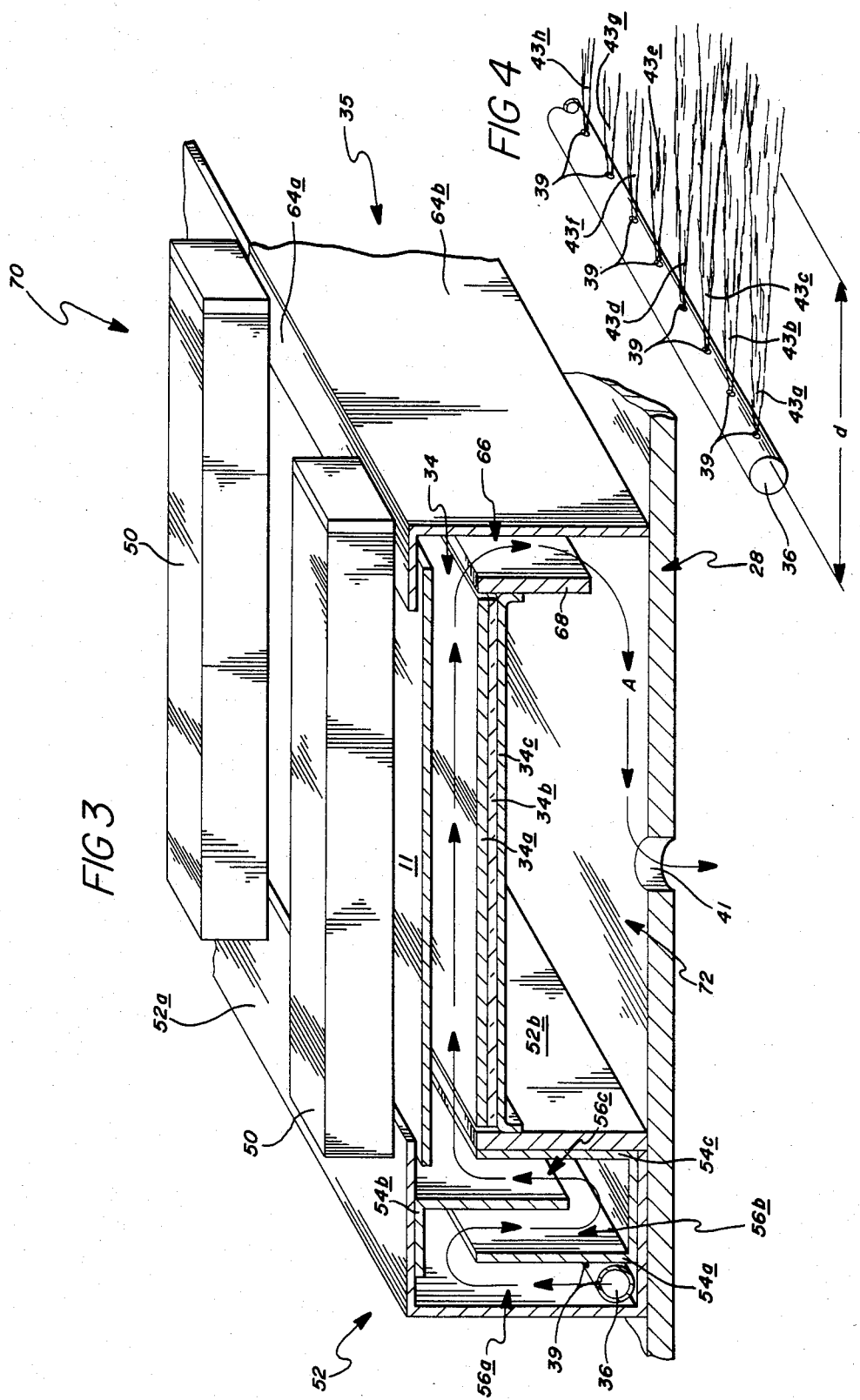

PROCESS GAS INTRODUCTION, CONFINEMENT AND EVACUATION SYSTEM FOR GLOW DISCHARGE DEPOSITION APPARATUS

CROSS REFERENCE TO RELATED APPLICATION

This patent application is a continuation-in-part of patent application Ser. No. 437,075 filed Oct. 27, 1982 of the same title, now U.S. Pat. No. 4,462,333.

FIELD OF THE INVENTION

This invention relates generally to apparatus for producing improved photovoltaic devices and more particularly to a process gas introduction, confinement and evacuation system for (1) substantially reducing flow pattern formation as semiconductor layers are deposited onto a substrate, and (2) exposing the entire transverse width of the substrate for deposition of semiconductor material thereonto.

BACKGROUND OF THE INVENTION

This invention relates to apparatus for continuously producing photovoltaic devices by depositing successive layers of semiconductor material onto a substrate as that substrate travels through operatively connected, dedicated deposition chambers, the composition of the semiconductor layers being dependent upon, inter alia, the particular process gas mixtures introduced into each of the deposition chambers. The deposition chambers are connected by a relatively narrow gas gate passageway through which the substrate material passes and which is adapted to isolate the process gases introduced into the first chamber from the process gases introduced into the adjacent deposition chamber. Despite the relatively small size of the gas gate passageways, a percentage of gases introduced into one chamber still back diffuses into the adjacent chamber, thereby contaminating the layer deposited in said adjacent chamber. In an effort to reduce the diffusion of process gases into adjacent chambers, deposition apparatus constructed by the assignee of the instant application have incorporated shields which at least partially surround the cathode region and which cooperate with introduction and evacuation conduits to inhibit the free flow of process gases from the cathode region. The process gases introduced into the cathode region are therefore directed to flow across the substrate for disassociation into plasma and subsequent deposition onto that substrate. However, the process gases, so introduced have been found to form flow patterns as they are deposited as semiconductor layers onto the surface of the substrate, thereby reducing the efficiency of photovoltaic devices produced therefrom.

In order to better understand the causes of flow line formation, it is helpful to refer to FIG. 4 in which the process gas supply conduit is depicted by the reference numeral 36. The supply conduit 36 is an elongated member including a plurality of spaced apertures 39 through which a plurality of streams of process gas mixtures 43a–43h enter the deposition chamber and are directed to the plasma region thereof. However, the streams of the process gas mixtures 43a–43h, retain their individual velocities and chemical compositions for a distance "d" as they travel from the supply conduit 36 toward the plasma region. As they reach the distance "d", adjacent streams of process gas mixture 43a–43h begin to interdiffuse to form a single, uniform, homogeneous stream of the process gas mixtures. Based upon the foregoing explanation, the flow pattern formation may now be understood as being due to the fact that (1) certain zones of the plasma region (defined as that region between the substrate and cathode in which an electrodynamic field is developed) may have streams of process gas mixtures flowing therethrough at a relatively slow velocity, while adjacent zones of the plasma region may have streams of process gas mixtures move quickly therethrough, and (2) the discrete streams of process gas mixtures may also include slightly different percentages of gaseous constituents, thereby forming mixtures of nonuniform and nonhomogeneous chemical composition. If the discrete streams of process gas mixtures from the plurality of spaced apertures are not provided with a sufficiently lengthy path of travel (the distance "d") prior to contacting the electrodynamic field developed in the plasma region, the nonhomogeneity and nonuniformity thereof will result in the localized deposition of nonhomogeneous, nonuniform semiconductor material upon surface of the substrate. And, since the rate of deposition of the semiconductor material onto the surface of the substrate is proportional, all other parameters being kept constant, to (1) the length of time which the process gases are subjected to the electrodynamic field and (2) the chemical composition of the process gas mixtures exposed to the electrodynamic field, flow patterns may be formed on the surface of the substrate in at least two ways. First, any localized zones, defined by the adjacent slowly and more rapidly moving streams of process gas mixtures, will necessarily mean that adjacent streams of process gas mixtures remain in the plasma region and are subjected to the electrodynamic field for varying lengths of time. The result is that the more slowly moving streams of process gas mixtures are deposited at a different rate than the streams of process gas mixtures which move more rapidly through the plasma region. Also, the slower moving process gas mixtures, being exposed to the field for a greater length of time than the faster moving mixtures, deposit compositionally different films onto the substrate surface. The differences in the length of time which process gas mixtures spend subjected to the electrodynamic field within the plasma region thereby defines the first manner in which the aforementioned flow patterns are formed.

The second manner in which flow patterns may be formed by semiconductor material depositing onto the surface of the substrate relates to the fact that the chemical composition of the process gas mixtures introduced into the plasma region from each of the plurality of spaced, discrete apertures vary slightly. Since (1) the chemical compositions of the process gas mixtures vary, and (2) different materials are deposited onto the substrate at different rates of deposition, the compositionally varying process gas mixtures deposit compositionally varying semiconductor material onto the surface of the substrate, thereby forming flow patterns indicative of the localized deposition of nonuniform, nonhomogeneous semiconductor material.

Further, in the deposition apparatus constructed by the assignee of this application, although each deposition chamber included a shield to direct the process gases through the plasma region to an evacuation port for withdrawal, the web of substrate was adapted to pass thereabove. Therefore, only the central section of the surface of the substrate was available for depositing semiconductor material thereonto. Accordingly, the prior art shield arrangements failed to make maximum use of the substrate surface area available for the production of semiconductor devices.

The present invention operates to substantially (1) reduce the formation of flow patterns on the layered substrate surface caused by either (a) the different rates of flow of the process gas mixtures traveling through the plasma region of a deposition chamber or (b) nonuniform, nonhomogeneous process gas mixtures entering that plasma region, and (2) expose the entire surface of the substrate traveling through the plasma region of a deposition chamber for depositing thereonto semiconductor material.

Recently, considerable efforts have been made to develop systems for depositing amorphous semiconductor alloys, each of which can encompass relatively large areas, and which can be doped to form p-type and n-type materials for the production of p-i-n type devices which are, in operation, substantially equivalent to their crystalline counterparts.

It is now possible to prepare amorphous silicon alloys by glow discharge techniques which possess (1) acceptable concentrations of localized states in the energy gaps thereof, and (2) high quality electronic properties. Such a technique is fully described in U.S. Pat. No. 4,226,898, entitled Amorphous Semiconductors Equivalent To Crystalline Semiconductors, which issued in the names of Stanford R. Ovshinsky and Arun Madan on Oct. 7, 1980; and by vapor deposition as fully described in U.S. Pat. No. 4,217,374, which issued in the names of Stanford R. Ovshinsky and Masatsugu Izu on Aug. 12, 1980, under the same title. As disclosed in these patents, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498, issued Aug. 16, 1960. The multiple cell structures therein discussed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by smaller band gap materials to absorb the light passed through the first cell. By substantially matching the generated currents from each cell, the overall open circuit voltages from each cell may be added, thereby making the greatest use of the light energy passing through the semiconductor device.

It is of obvious commercial importance to be able to mass produce photovoltaic devices. Unlike crystalline silicon, which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications and patents: U.S. Pat. No. 4,400,409 issued Aug. 23, 1983 for A Method Of Making P-Doped Silicon Films And Devices Made Therefrom; Ser. No. 244,386, filed Mar. 16, 1981 for Continuous Systems For Depositing Amorphous Semiconductor Material; U.S. Pat. No. 4,410,558, issued Oct. 18, 1983, for Continuous Amorphous Solar Cell Production System; U.S. Pat. No. 4,438,723, issued Mar. 27, 1984 for Multiple Chamber Deposition And Isolation System And Method; and U.S. Pat. No. 4,492,181, issued Jan. 8, 1985, for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material.

In making a solar cell of p-i-n type configuration, the first chamber is preferably dedicated for depositing a p-type amorphous silicon alloy, the second chamber is preferably dedicated for depositing an intrinsic amorphous silicon alloy, and the third chamber is preferably dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the back diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

While the foregoing discussion dealt with the production of semiconductor devices from a continuously moving web of substrate material, the process gas introduction, confinement and evacuation system of the present invention is equally adaptable for use with batch processing apparatus because it is equally likely that zones of localized process gas velocity will be formed from nonuniform, nonhomogeneous process gas mixtures introduced into those batch processing chambers which employ process gas introduction systems structurally similar to those of continuous process apparatus.

Regardless of whether the glow discharge deposition chamber is adapted for the continuous or batch production of semiconductor devices, the movement of adjacent streams of process gases from the apertured introduction manifold though the plasma region, as well as the homogeneity and uniformity of those adjacent streams of process gases introduced into the plasma region from the spaced apertures of the introduction manifold, as discussed hereinabove, can cause the nonuniform, nonhomogeneous deposition of semiconductor material onto the surface of the substrate, thereby forming flow patterns. Further, in said prior chambers, the edges of the substrate were covered by the flanges of the cathode shield, thereby preventing semiconductor material from being deposited thereonto.

It is therefore one object of the present invention to provide apparatus which will substantially reduce the formation of flow patterns of semiconductor layers deposited onto the substrate surface, said patterns caused by (1) zones of slower and more rapidly moving streams of process gas mixtures passing through the plasma region of the deposition chamber, and (2) the flow of nonuniform, nonhomogeneous process gas mixtures through the plasma region of the deposition chamber.

It is another object of the present invention to increase the length of the opposed, horizontally extending flanges of the cathode shield so that the substrate can be positioned below the flange for exposing the entire transverse surface of said substrate for the deposition of semiconductor material thereonto.

These and other objects and advantages of the present invention will become clear from the drawings, the claims and the detailed description of the invention which follow.

BRIEF SUMMARY OF THE INVENTION

Disclosed herein is a process gas introduction, confinement and evacuation system for glow discharge deposition apparatus. The system includes a baffled gas introduction manifold adapted to substantially prevent the formation of flow patterns in the semiconductor material deposited upon a substrate, which flow patterns are caused by the flow of nonuniform, nonhomogeneous process gas mixtures through the plasma region of a deposition chamber. In the preferred embodiment, the glow discharge deposition apparatus includes at least two isolated deposition chambers operatively connected by a gas gate which is adapted to isolate the process gas environments of the adjacent chambers of each pair of deposition chambers. As discussed above, this invention is applicable to any deposition chamber in which flow pattern formation due to the introduction of nonuniform, nonhomogeneous process gas mixtures is a problem.

The gas gate includes a relatively narrow passageway through which a substrate moves from the first of the adjacent deposition chambers wherein process gases deposit a first semiconductor layer thereonto, to the second of said deposition chambers wherein a differing set of process gases deposit a second semiconductor layer atop the first layer. Each of the deposition chambers is provided with an apertured process gas introduction manifold adjacent the cathode region thereof for spacedly introducing the process gases which are to be disassociated and deposited as a semiconductor film onto the substrate. If the process gas mixtures which enter the cathode region from the spaced apertures of the introduction manifold are nonuniform and nonhomogeneous, nonuniform thicknesses of nonhomogeneous semiconductor material will be deposited onto the substrate surface. The novel manifold described and claimed herein includes a series of staggered baffle plates about which the discrete streams of process gas mixtures circuitously flow prior to entering the cathode region and contacting the electrodynamic field developed between the substrate and the cathode, thereby substantially preventing the formation of flow patterns. The baffled manifold serves function of (1) thoroughly mixing the process gases prior to their entry into the plasma region to insure that (1) only homogeneous, uniform process gas mixtures enter the plasma region, and (2) the discrete streams of process gases flow through the plasma region at substantially identical velocities.

The introduction, confinement and evacuation system disclosed by the present application is also adapted to make full use of the surface area of the substrate upon which it is possible to deposit semiconductor material. Said system includes spaced, elongated, generally horizontally disposed flanges on opposed sides of the cathode shield. These flanges are spaced apart a distance greater than the width of the substrate so that the substrate may travel therebelow with the edges of the flanges overlaying the sides of the substrate. In this manner, the entire surface of the substrate is exposed for the deposition thereonto of semiconductor material.

BRIEF DESCRIPTION OF THE DRAWINGS

FIG. 3 is an enlarged, fragmentary perspective view of the cathode region of a deposition chamber illustrating the process gas introduction, confinement and evacuation system of the present invention; and FIG. 4 is an enlarged, fragmentary perspective view of the discrete streams of process gas mixtures introduced from the supply conduit of FIG. 3 into the deposition chamber.

DETAILED DESCRIPTION OF THE DRAWINGS

I. The Photovoltaic Cell

Figure 1:
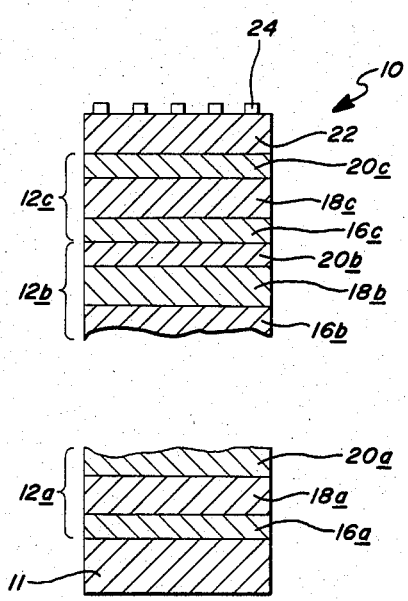
FIG. 1 is a fragmentary, cross-sectional view of a tandem photovoltaic device comprising a plurality of p-i-n type cells, each layer of the cells formed from a semiconductor alloy.

Referring now to the drawings and particularly to FIG. 1, a photovoltaic cell, formed of a plurality of successive p-i-n layers, each of which includes an amorphous semiconductor alloy, is shown generally by the numeral 10. It is for the production of this type of photovoltaic device, wherein amorphous semiconductor layers are continuously deposited onto a moving substrate in successive, isolated deposition chambers, that the process gas introduction, confinement and evacuation system of the present invention was primarily developed.

More particularly, FIG. 1 shows a p-i-n type photovoltaic device such as a solar cell made up of individual p-i-n type cells 12a, 12b, and 12c. Below the lowermost cell 12a is a substrate 11 which may be transparent or formed from a metallic material such as stainless steel, aluminum, tantalum, molybdenum, or chrome. Although certain applications may require a this oxide layer and/or a series of base contacts prior to application of the amorphous material, for purposes of this application, the term "substrate" shall include not only a flexible film, but also any elements added thereto by preliminary processing.

Each of the cells 12a, 12b, and 12c are fabricated with an amorphous semiconductor body containing at least a silicon alloy. Each of the semiconductor bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the process gas introduction, confinement and evacuation system of this invention may also be used with apparatus adapted to produce single or multiple n-i-p, n-p, or p-n cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
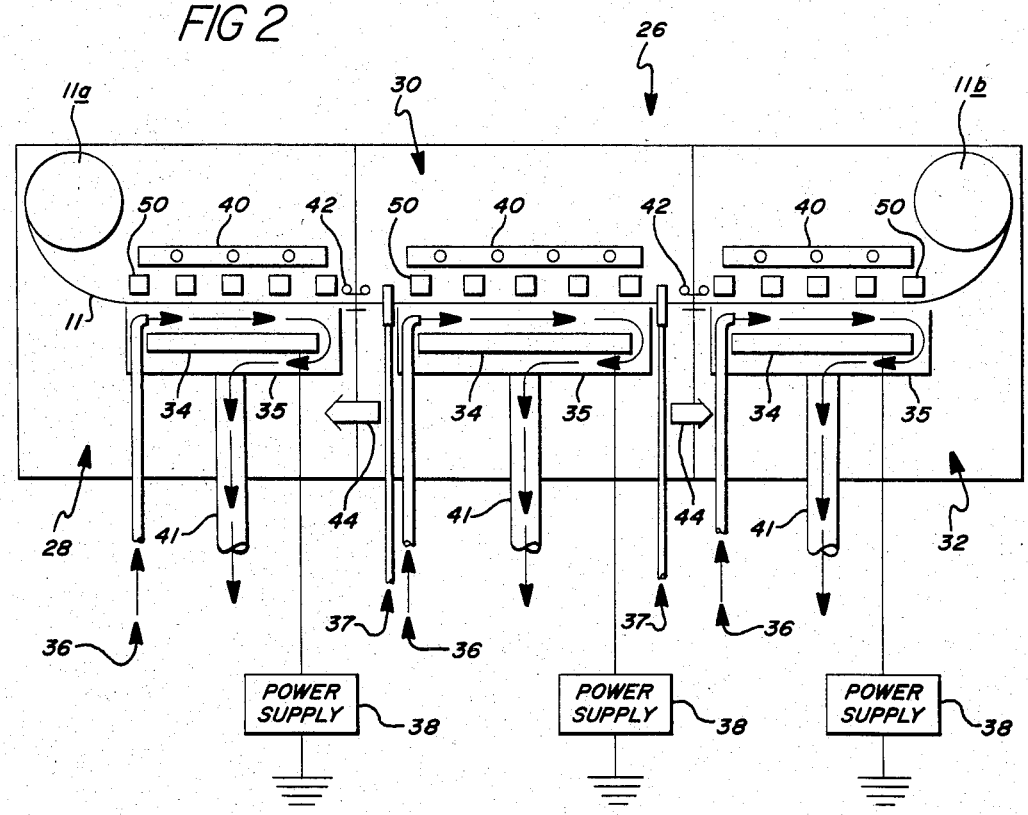
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of a multiple glow discharge chamber deposition apparatus for the continuous production of photovoltaic cells is generally illustrated by the reference numeral 26. It must again be noted that, while continuous deposition apparatus represents the preferred embodiment of the present invention, the instant confinement system may also be used with batch processing deposition apparatus. The continuous deposition apparatus 26 includes a plurality of isolated, dedicated deposition chambers, each chamber of which is interconnected by a gas gate through which sweep gases and a web of substrate material are adapted to pass.

The apparatus 26 is adapted to mass produce large area, amorphous photovoltaic cells having a p-i-n configuration on the deposition surface of substrate material 11 which is continually fed therethrough. To deposit the amorphous semiconductor layers required for producing multiple p-i-n type cells, the apparatus 26 includes at least one triad of deposition chambers. Each triad of deposition chambers comprises: a first deposition chamber 28 in which a p-type conductivity amorphous semiconductor layer is deposited onto the deposition surface of the substrate 11 as the substrate 11 passes therethrough; a second deposition chamber 30 in which an intrinsic amorphous semiconductor layer is deposited atop the p-type semiconductor layer on the deposition surface of the substrate 11 is the substrate 11 passes therethrough; and a third deposition chamber 32 in which an n-type conductivity semiconductor layer is deposited atop the intrinsic layer on the deposition surface of the substrate 11 as the substrate 11 passes therethrough. It should be apparent that, (1) although, only one triad of deposition chambers has been illustrated, additional triads or additional individual chambers may be added to the apparatus to provide the machine with the capability of producing photovoltaic cells having any number of amorphous p-i-n type layers; (2) the process gas introduction, confinement and evacuation system of the present invention is applicable to any machine in which gases are fed into each of a plurality of isolated chambers and those gases must be confined to a specific region within each of those chambers; (3) the substrate supply core 11a and the substrate take-up core 11b are shown in the deposition chambers for illustrative purposes only, while in reality the cores would be housed in separate chambers operatively connected to the deposition chambers; and (4) although the glow discharge process illustrated herein employs an r.f. powered cathode, other glow discharge techniques may be employed without departing from the spirit of the present invention.

Each deposition chamber 28, 30 and 32 of the triad is adapted to deposit a single amorphous silicon alloy layer, by glow discharge deposition onto the substrate 11. To that end, each of the deposition chambers 28, 30 and 32 includes: a cathode 34; a shield 35 disposed about each of the cathodes 34; a process gas introduction manifold 36; an inert sweep gas conduit 37 disposed on opposed sides of the intrinsic deposition chamber; a radio frequency generator 38; a process gas and plasma evacuation conduit 41; a plurality of transversely extending magnetic elements 50; a plurality of radiant heating elements shown schematically as 40 in FIG. 2; and a gas gate 42 operatively connecting the intrinsic deposition chamber to each of the dopant chambers.

The introduction manifolds 36 are operatively associated with the respective cathodes 34 to deliver process gas mixtures to the plasma regions created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The radio frequency generators 38 operate in conjunction with the cathodes 34, the radiant heaters 40 and the grounded substrate 11 to form the plasma by disassociating the reaction gases entering the deposition chambers into deposition species. The deposition species are then deposited onto the bottom surface of the substrate 11 as amorphous semiconductor layers. The substrate 11, preferably of magnetic material, is maintained substantially flat by the plurality of rows of magnetic elements 50 which provide an attractive force urging the magnetic substrate upwardly, out of its normal sagging path of travel.

To form the photovoltaic cell 10 illustrated in FIG. 1, a p-type amorphous semiconductor layer is deposited onto the substrate 11 in the deposition chamber 28, an intrinsic amorphous semiconductor layer is deposited atop the p-type layer in the deposition chamber 30 and an n-type amorphous semiconductor layer is deposited atop the intrinsic layer in the deposition chamber 32. As a result, the apparatus 26, deposits at least three successive amorphous semiconductor layers onto the substrate 11 wherein the intrinsic layer deposited in deposition chamber 30 differs in composition from the layers deposited in deposition chambers 28 and 32 by the absence (in quantitatively significant amounts) of at least one element which will be referred to as the dopant or doping species.

It is important that each semiconductor layer deposited onto a surface of the substrate 11, in order to produce high efficiency photovoltaic devices, be of high purity, of homogeneous composition across said substrate surface and of uniform thickness across said substrate surface. In order to achieve these objectives, it is therefore necessary to (1) provide substantially uniform velocities of all of the streams of the process gas mixtures flowing across the layered surface of the substrate, and (2) to introduce only homogeneous, uniform process gas mixtures into the plasma. Finally, it is important that the available surface area of the substrate be fully exploited so as to maximize efficiency of the apparatus.

III. The Process Gas Introduction, Confinement and Evacuation System of the Present Invention Referring now to FIG. 3, the process gas introduction, confinement and evacuation system of the present invention is illustrated generally by the reference numeral 70. As depicted therein, the system 70 is adapted to produce improved photovoltaic cells by (1) fully mixing the process gases in a baffled manifold prior to entry of those gases into the plasma region of the deposition chambers so as to prevent the process gases entering the plasma region of a deposition chamber from forming flow patterns as the gases are deposited onto the deposition surface of the substrate 11; and (2) exposing substantially the entire transverse width of the substrate for the deposition of semiconductor material thereonto.

As applied herein, the term "cathode region" shall mean that portion of each chamber of the deposition apparatus which is substantially contiguous to the cathode 34. This cathode region shall include the area of the chamber above, below and to either side of said cathode. The term "cathode" shall be applied herein to include the actual cathode plate 34a, the glass insulating sheet 34b upon which the cathode plate 34a rests, and the r.f. plate 34c upon which the insulating sheet rests and which is connected to the r.f. power source 38 (not shown in FIG. 3). Further, the term "plasma region" shall refer to that portion of the cathode region, between the cathode 34 and the substrate 11, in which an electrodynamic field is developed to disassociate the process gas mixture introduced into the cathode region and deposit a semiconductor film onto the exposed surface of the substrate 11.

Process gases, such as silane, silicon-tetrafluoride, germane, disilane, boron, phosphine, argon and/or hydrogen are introduced into the deposition chamber through the process gas introduction manifold 36 and are directed therefrom to flow through the plasma region for disassociation and deposition onto the substrate. The process gases and plasma are preferably confined to the cathode region by a surrounding cathode shield, shown generally by reference numeral 35, to insure that unused process gases and nondeposited plasma are removed from the cathode region before those unused gases and nondeposited plasma can migrate from the cathode region toward a gas gate 42 (the migration being due to the pressure differential maintained between adjacent deposition chambers to establish a unidirectional flow of gases through said gas gate). If the gases and plasma are permitted to escape from the cathode region, freely migrate about the interior of the deposition chamber, and contact the chamber walls, they will form silane powder which may settle between semiconductor layers deposited onto the substrate 11. The shield 35 directs the process gases and plasma toward the evacuation conduit 41 disposed at the downstream portion of the cathode region.

Some prior deposition systems also introduced gases, such as hydrogen, argon or other inert gas mixtures, at the intrinsic chamber side of the gas gate 42 to reduce the volume of process gases escaping from the cathode region. More particularly, inert "sweep" gases were directed to flow from the supply conduits 37 (see FIG. 2), disposed on the intrinsic deposition chamber side of the gas gate 42, predominantly through the gas gate passageway 43 to the dopant chamber side of the gas gate. Sufficient quantities (about 250 SCCM) of sweep gas were introduced to insure that about 35 SCCM of the sweep gas flowed into the cathode region of the intrinsic deposition chamber from each of the conduits 37. The sweep gas was drawn, by the pressure differential established between the interior of the deposition chamber and the evacuation conduit 41, into the cathode region from which it exited with the unused process gases and nondeposited plasma via said evacuation conduit.

The process gas introduction, confinement and evacuation system 70 of the instant application cooperates with the inert gas flow and gas gates to substantially reduce the leakage of unused process gas and nondeposited plasma from the cathode region in substantially the same manner as the prior art shielding arrangements, while, also substantially reducing the formation of flow patterns created by nonhomogeneous and nonuniform process gas mixtures flowing through the plasma region.

Structurally, the system includes a generally elongated, longitudinally extending, horizontally disposed process gas supply conduit 36. The supply conduit 36 is oriented in a plane substantially parallel to the plane of the substrate 11 and is substantially coextensive with the longitudinal length of the cathode 34 (or cathodes, if more than one cathode is used in a chamber). The supply conduit 36 has a plurality of apertures 39 spaced along the length thereof so as to introduce a plurality of discrete streams of process gas mixtures into the plasma region of the deposition chamber along the entire length of the cathode.

The apertured supply conduit 36 is housed within a process gas introduction manifold, generally referred to by the reference numeral 52. The introduction manifold 52 is an elongated member of generally rectangular peripheral configuration and is adapted for operative disposition adjacent one of the longitudinal edges of the web of substrate material 11. The length and the positioning of the introduction manifold 52 is such as to direct the streams of process gas mixtures from the apertures 39 in the supply conduit 36 into the plasma region of the deposition chamber. In order to introduce only homogeneous, uniform streams of process gas into the plasma region, the introduction manifold 52 is divided into a plurality of interconnected compartments by a plurality of staggered or offset baffle plates, shown generally by reference numeral 54, which extend across the longitudinal length of the substrate 11. More particularly, the apertured supply conduit 36 is housed within an elongated baffle chamber 56a so that discrete streams of process gas expelled from the apertures 39 thereof must traverse a lengthy, circuitous path of travel about baffle plate 54a, through baffle chamber 56b, about baffle plate 54b, through baffle chamber 56c and about baffle plate 54c prior to entering the plasma region, being disassociated by the electrodynamic field and being deposited as semiconductor material onto the surface of the substrate 11. In this manner, the baffled manifold 52 (1) thoroughly mixes the process gases introduced from the discrete apertures 39 of the introduction manifold 36 before those gases enter the plasma region, thereby presenting a uniform, homogeneous mixture of process gases for disassociation and deposition; and (2) insures that the flow rate of the plurality of discrete process gas streams across the cathode 34 is constant so as to prevent adjacent process gas streams of varying velocity from being nonuniformally and nonhomogeneously deposited onto the substrate surface, and (3) directs the process gases across the entire transverse width of the web of substrate material (perpendicular to the direction of substrate movement). The unused process gases and nondeposited plasma are then withdrawn from the plasma region, about the downstream side of the cathode opposite the side at which the manifold 52 is disposed (arrow A in FIG. 3 indicates the path of travel of the process gases) and through the evacuation conduit 41.

The top wall 52a of the manifold 52 cooperates with an upper, confinement wall 64a of the right-hand confinement wall 64b of the cathode shield 35 to provide a pair of oppositely disposed supporting shelves on which ends of the elongated ceramic magnet assemblies 50 may rest. The magnetically attractive web of substrate material 11, which is of a width greater than the distance separating the top manifold wall 52a and the upper confinement wall 64a is then positioned underneath the "shelves". Because of the attractive force of the magnet assemblies 50, the web of substrate material 11 is urged upwardly so that the opposed longitudinal edges of said substrate abut and seal against the top manifold wall 52a on one side, and the top confinement wall 64a on the other.

The unused process gases and nondeposited plasma flow from the plasma region through a side channel 66 formed between generally upright confinement wall 64b and generally upright cathode supporting wall 68. The central portion of the supporting wall 68 is raised above the surface of the chamber 28 to allow the gases and plasma to flow from the side channel 66 through the cutaway portion of the supporting wall 68 and into the evacuation compartment 72 from which they exit via conduit 41. The evacuation compartment 72 is defined as that area between the r.f. plate 34c, the bottom wall of the deposition chamber 28, the right-hand supporting wall 68 and the inner, upright manifold wall 52b. This relationship of the substrate 11 to the process gas introduction, confinement and evacuation system exposes the entire bottom surface of the web of substrate material 11 for the deposition of semiconductor material thereonto. By exposing the entire bottom deposition surface of the web of substrate material 11, maximum use is made of the substrate surface area available for the production of semiconductor devices.

It should be apparent that while the preferred embodiment contemplates the use of the plurality of staggered baffle plates 54 to introduce homogeneous, uniform process gas streams into the plasma region, other methods of achieving uniformity and homogeneity of streams of process gas mixtures may be employed without departing from the spirit and scope of the instant invention. For example, in those instances where sufficient room is available, the baffle plates may be eliminated and the straight line distance that the process gas streams must flow prior to entering the plasma region may be increased so that the adjacent streams of process gas mixtures thoroughly interdiffuse for presenting a single substantially uniform and homogeneous process gas mixture to the plasma region. As a specific example of operating parameters, if the introduction conduit 36 includes a plurality of ⅛ inch apertures 39 spaced about 2 inches apart and adapted to permit flow at a rate of approximately 250 SCCM, a path of travel (the distance "d" of FIG. 4) of at least eight inches, whether baffled or straight line, is necessary to thoroughly mix the adjacent streams of process gases.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What we claim is:

1. In an isolated glow discharge deposition chamber adapted for the deposition of layers of semiconductor material onto a large area substrate, the chamber including: a cathode spaced from the substrate; means for introducing streams of process gas into the plasma region formed between the cathode and substrate; and means for energizing the cathode to disassociate the process gas into plasma and deposit semiconductor material onto the substrate; the improvement comprising, in combination:

an elongated, apertured manifold adapted to introduce streams of process gas into the deposition chamber, said manifold spaced upstream of and remote from said plasma region;

pattern prevention means operatively disposed upstream of the plasma region, said means cooperatively associated with the manifold so as to (1) introduce only uniform streams of process gas into the deposition chamber, (2) homogenize and interdiffuse all of the adjacent streams of process gas into a single stream prior to the entry thereof into the plasma region; and (3) move the single, substantially uniform and homogeneous stream of process gas through the plasma region at a single rate of flow, whereby the formation of patterns is substantially prevented and semiconductor material of substantially uniform chemical, optical and electrical characteristics is deposited.

2. Apparatus as in claim 1, wherein the pattern prevention means comprises a baffled manifold including staggered baffle plates about which the streams of process gas are directed prior to contacting the deposition surface of the substrate.

3. Apparatus as in claim 2, wherein the process gas introduction means comprises a conduit housed within a chamber of the baffled manifold, said conduit including a plurality of spaced apertures through which streams of process gas enter the deposition chamber.

* * * * *